(12) United States Patent
Burggraf et al.

(10) Patent No.: US 11,024,530 B2
(45) Date of Patent: Jun. 1, 2021

(54) METHOD FOR THE BONDING AND DEBONDING OF SUBSTRATES

(71) Applicant: EV Group E. Thallner GmbH, St. Florian am Inn (AT)

(72) Inventors: Jurgen Burggraf, Scharding (AT); Harald Wiesbauer, Ried im Innkreis (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 4 days.

(21) Appl. No.: 16/575,493

(22) Filed: Sep. 19, 2019

(65) Prior Publication Data

US 2020/0013663 A1    Jan. 9, 2020

Related U.S. Application Data

(62) Division of application No. 15/749,960, filed as application No. PCT/EP2016/075571 on Oct. 24, 2016, now Pat. No. 10,468,286.

(30) Foreign Application Priority Data

Nov. 2, 2015    (DE) .......................... 102015118742.6

(51) Int. Cl.
*B32B 43/00*    (2006.01)
*H01L 21/683*    (2006.01)
(Continued)

(52) U.S. Cl.
CPC .......... *H01L 21/6835* (2013.01); *H01L 24/94* (2013.01); *H01L 24/98* (2013.01);
(Continued)

(58) Field of Classification Search
CPC ......... B32B 9/045; B32B 7/023; B32B 7/027; B32B 7/10; B32B 7/12; B32B 38/10; B32B 43/006; Y10T 156/1158; Y10T 156/1917
(Continued)

(56) References Cited

U.S. PATENT DOCUMENTS

| 5,965,065 A | 10/1999 | Powell |
| 8,679,280 B2 | 3/2014 | Dang et al. |

(Continued)

FOREIGN PATENT DOCUMENTS

| JP | 2003203886 A | 7/2003 |
| JP | 2012-106486 A | 6/2012 |

(Continued)

OTHER PUBLICATIONS

"Laser ablation—Wikipedia," Aug. 23, 2007, URL:https://en.wikipedia.org/w/index.php?, Title=Laser ablation&oldid=153061511, retrieved from the Internet Jun. 18, 2020, Reference D5 (XP055706316) identified in the European First Examination Report issued in connection with corresponding European Patent Application No. 16790304.6, dated Jun. 30, 2020.

(Continued)

*Primary Examiner* — Mark A Osele
*Assistant Examiner* — Nickolas R Harm
(74) *Attorney, Agent, or Firm* — Kusner & Jaffe

(57) ABSTRACT

A product-substrate-to-carrier-substrate bond with a product substrate, which is bonded to a carrier substrate via a connection layer, wherein a soluble layer is arranged between the connection layer and the product substrate, and wherein a) the soluble layer is soluble due to an interaction with an electromagnetic radiation of a radiation source, and b) the connection layer and the carrier substrate are both at least predominantly transparent to the electromagnetic
(Continued)

radiation transmitted through the connection layer, wherein a material of the soluble layer and the electromagnetic radiation are chosen such that an increase of temperature of the soluble layer caused by the interaction with the electromagnetic radiation is less than 50° C.

7 Claims, 2 Drawing Sheets

(51) Int. Cl.
- *H01L 23/00* (2006.01)
- *B32B 38/10* (2006.01)
- *B32B 7/023* (2019.01)
- *B32B 9/04* (2006.01)
- *B32B 7/12* (2006.01)
- *B32B 7/10* (2006.01)

(52) U.S. Cl.
CPC ............... *B32B 7/023* (2019.01); *B32B 7/10* (2013.01); *B32B 7/12* (2013.01); *B32B 9/045* (2013.01); *B32B 38/10* (2013.01); *B32B 43/006* (2013.01); *H01L 2221/68318* (2013.01); *H01L 2221/68381* (2013.01); *H01L 2224/98* (2013.01); *Y10T 156/1158* (2015.01); *Y10T 156/1917* (2015.01)

(58) Field of Classification Search
USPC .............................. 156/712, 753; 428/411.1
See application file for complete search history.

(56) References Cited

U.S. PATENT DOCUMENTS

| | | | |
|---|---|---|---|
| 9,682,532 | B2 | 6/2017 | Kubo et al. |
| 10,094,024 | B2 | 10/2018 | Fujii et al. |
| 2009/0111279 | A1 | 4/2009 | Sakashita |
| 2009/0218560 | A1 | 9/2009 | Flaim et al. |
| 2009/0314438 | A1 | 12/2009 | Iwata et al. |
| 2010/0186883 | A1 | 7/2010 | Tomoda |
| 2012/0077313 | A1 | 3/2012 | Homma et al. |
| 2013/0084459 | A1 | 4/2013 | Larson et al. |
| 2014/0141253 | A1 | 5/2014 | Fujii et al. |
| 2014/0144593 | A1 | 5/2014 | Dang et al. |
| 2015/0083343 | A1 | 3/2015 | Fujii et al. |

FOREIGN PATENT DOCUMENTS

| | | |
|---|---|---|
| JP | 2013-172033 A | 9/2013 |
| KR | 10-2014-0039310 A | 4/2014 |
| WO | WO-2012/118700 A1 | 9/2012 |
| WO | WO 2012/176607 A1 | 12/2012 |
| WO | WO-2014/058601 A1 | 4/2014 |
| WO | WO-2016/112975 A1 | 7/2016 |

OTHER PUBLICATIONS

International Search Report from corresponding International Patent Application No. PCT/EP2016/075571, dated Jan. 17, 2017.

METHOD FOR THE BONDING AND DEBONDING OF SUBSTRATES

RELATED APPLICATIONS

This application is a divisional of U.S. application Ser. No. 15/749,960, filed Feb. 2, 2018, which is a U.S. National Stage Application of PCT/EP2016/075571 filed Oct. 24, 2016, which claims priority from German Patent Application No. 102015118742.6, filed Nov. 2, 2015, said patent applications hereby fully incorporated herein by reference.

FIELD OF THE INVENTION

The present invention relates to a method for bonding a product substrate via a connection layer to a carrier substrate, as well as to a method for debonding a product substrate from a carrier substrate bonded via a connection layer to the product substrate, and to a product-substrate-to-carrier-substrate bond.

BACKGROUND OF THE INVENTION

A number of methods for debonding/separating two substrates (product substrate and carrier substrate) are known from the state of the art. Most methods use so-called bonding adhesives for achieving a temporary bond between two substrates, which can be easily undone. The bonding adhesives are normally polymers, in particular thermoplastics.

A first method for the temporary bonding includes coating the entire surface of a substrate. The second substrate is connected to the first substrate by a bonding operation. Separation, i.e. debonding of the two substrates is effected by a shearing process at a raised temperature. This temperature preferably lies above the glass transition temperature of the bonding adhesive. Due to the shearing force applied it is possible to move both substrates relative to each other in a very slow process and thus to separate them from each other.

A second method for temporary bonding includes treating specific surface areas of the carrier substrate in such a way that the adhesive effect between these surface areas and the bonding adhesive is minimal, in particular completely disappears. Apart from these specifically treated surface areas a very small surface area remains, which is left untreated. This highly adhesive surface area is normally a peripheral circular ring a few millimetres thick. Following this specific treatment the carrier substrate is coated full-surface with the bonding adhesive. Then follows a normal bonding operation. The debonding operation is usually carried out by chemical means in that the rim zone of the bonding adhesive is debonded, thereby reducing the adhesive power between the bonding adhesive and the carrier substrate. Thereafter the carrier substrate can be very easily lifted off the product substrate.

A further method for separating two substrates from each other includes applying a special soluble layer onto, in particular, a transparent carrier substrate, before the bonding adhesive is applied. Because the carrier substrate is transparent to a specific electromagnetic radiation, the photons are allowed unhindered access to the soluble layer. The photons cause a change in the soluble layer, reducing the adhesive power to the bonding adhesive. Such a method has been described in WO2014058601A1, in which a UV laser is fired onto a soluble layer on the inside of a carrier substrate in order to obtain a reaction there, which causes the bonding adhesive to separate from the carrier substrate and thus causes the carrier substrate to separate from the product substrate.

SUMMARY OF THE INVENTION

It is the requirement of the invention to propose a method and a device, with which an optimised process of bonding and debonding/separating is achieved and with which subsequent method steps are simplified.

This requirement is met by the characteristics of the independent claim(s). Advantageous further developments of the invention are cited in the sub-claims. The scope of the invention also encompasses all combinations of at least two characteristics indicated in the description, the claims and/or the figures. Where value ranges are indicated, values falling within the cited limits shall be considered to be disclosed as threshold values and to be claimable in any random combination.

The invention is based on the idea of proposing a method and a device, with which a product-substrate-to-carrier-substrate bond can be achieved, where the two can be connected via a connection layer transparent at least predominantly to an electromagnetic radiation, wherein a soluble layer is arranged between the connection layer and the product substrate which is designed to be soluble as a result of an interaction with an electromagnetic radiation of a radiation source.

As regards the method the invention can be realised during bonding by applying the following characteristics/steps:
a) the soluble layer is soluble due to interaction with an electromagnetic radiation of a radiation source and
b) the connection layer and the carrier substrate are both at least predominantly transparent to the electromagnetic radiation.

As regards the method the invention can be realised during debonding by in particular applying the following characteristics/steps:
a) the soluble layer (3) is dissolved due to interaction with an electromagnetic radiation of a radiation source and
b) the connection layer (4) and the carrier substrate (5) are both at least predominantly transparent to the electromagnetic radiation.

As regards the device the invention can be realised in particular by the following characteristics:
a) the soluble layer is soluble due to interaction with an electromagnetic radiation of a radiation source and
b) the connection layer (4) and the carrier substrate (5) are both at least predominantly transparent to the electromagnetic radiation.

An in particular independent aspect of the invention includes using a bonding adhesive (connection layer), which has a low absorption coefficient within the wavelength range of the electromagnetic radiation, in particulars lasers. The absorption coefficient, here in particular the linear absorption coefficient, is preferably standardised to mass density. The mass absorption coefficients thus obtained can then be compared to each other. The mass absorption coefficients can be obtained from the NIST X-ray attenuation databases (http://www.nist.gov/pml/data/xraycoef) for elements and some organic compounds for Roentgen radiation. Since mass absorption coefficients are very strongly dependent on the wavelength, wavelength ranges and mass absorption coefficient ranges are indicated below for some pure elements and some organic compounds, in particular polymers.

| Material | Energy range MeV | Wavelength range Nm | Mass absorption coefficient range $cm^2/g$ |
|---|---|---|---|
| Lead | $10^{-6}$-$10^2$ | 1240-1.2*$10^{-5}$ | $10^{-2}$-$10^5$ |
| Polystyrene | $10^{-6}$-$10^2$ | 1240-1.2*$10^{-5}$ | $10^{-2}$-$10^5$ |
| PMMA | $10^{-6}$-$10^2$ | 1240-1.2*$10^{-5}$ | $10^{-2}$-$10^5$ |
| Teflon | $10^{-6}$-$10^2$ | 1240-1.2*$10^{-5}$ | $10^{-2}$-$10^5$ |
| MyLAR | $10^{-6}$-$10^2$ | 1240-1.2*$10^{-5}$ | $10^{-2}$-$10^5$ |
| Polyethylene | $10^{-6}$-$10^2$ | 1240-1.2*$10^{-5}$ | $10^{-2}$-$10^5$ |

The value ranges of the mass absorption coefficient in the NIST X-ray attenuation database are indicated for the MeV definition range between $10^{-3}$ MeV and $10^2$ MeV. This definition range does not allow any direct reading of the mass absorption coefficient in the UV range, since the UV range lies in the $10^{-5}$ MeV definition range. However, the value range of the mass absorption coefficients for the elements of carbon, nitrogen and oxygen in the desired UV range is known from U.S. Pat. No. 5,965,065A. Carbon above all is a main component of organic polymers. Even if conclusions cannot be automatically drawn from the mass absorption coefficient of a pure component as to the mass absorption coefficient of a compound, at least the value ranges for the mass absorption coefficient of the compound can nevertheless be estimated. From all this data one can recognise that the mass absorption coefficient for the compounds according to the invention changes within an energy definition range of $10^{-6}$-$10^2$ MeV between about $10^{-2}$-$10^5$ $cm^2/g$. This is a value range of seven times the power of ten. The U.S. Pat. No. 5,965,065A also shows that the mass absorption coefficient for carbon changes within one-times the power of ten from 1000 eV to 100 eV between 1000 $cm^2/g$ and $10^{-6}$ $cm^2/g$. Further an absorption edge for carbon can be recognised at about 300 eV. All this data reveals that a small change in the energy or wavelength range can cause a big change in the absorption properties of the material. Therefore it is not possible and does not serve any purpose to specify a single value for the mass absorption coefficient for one material, in particular for all possible materials according to the invention.

It is therefore possible according to the invention to apply the soluble layer to the product substrate instead of the carrier substrate. Due to the low absorption of the electromagnetic radiation through the bonding adhesive enough photons reach the soluble layer in order to initiate there the separating operation or the debonding operation.

The invention also relates to a plant and method for debonding or separating two substrates with the aid of an electromagnetic photon source, in particular a laser. In particular the invention is based on the idea to direct, or in particular to focus, the electromagnetic radiation onto a soluble layer in order to reduce adhesion between the product substrate and the carrier substrate. The electromagnetic radiation is sent through the bonding adhesive with which the two substrates are connected to each other, without, in particular, heating it up.

The inventive idea therefore includes the use of a specially matched combination of bonding adhesive, electromagnetic radiation and soluble layer.

One advantage of the invention is that the soluble layer can be applied to the product substrate. The soluble layer is therefore located between the product substrate and the connection layer. If irradiation of the soluble layer, due to electromagnetic radiation, in particular a laser, leads to a lowering of the adhesion, the product substrate can be directly separated from the bonding adhesive, in particular automatically. The product substrate is therefore freed from the bonding adhesive preferably immediately after separating and does not require any chemical cleaning.

The soluble layer is preferably designed in such a way that it is completely destroyed, in particular sublimated during the inventive negative impacting.

The electromagnetic radiation interacts with the electrons of the material. The interaction is due to the fact that the electromagnetic alternating field can cause the electrically charged electrons to vibrate. The positively charged core has a mass much bigger by far and thus is more inert in relation to the electrons. The movement of the core is therefore ignored most of the time.

An electromagnetic alternating field can, independently of its frequency, engender different physical effects in solid bodies, in particular in molecules. Since the inventive idea of the patent specification relates in the main to polymers, physical effects in particular will from now on be described by way of molecules, in particular polymers.

Molecules or parts of a molecule, under certain conditions, are able to absorb photons and to convert the photon energy into vibrational and/or rotational and/or positional energy. In order to ensure that such a conversion of energy can take place, the photons must have a certain frequency. The new energy state generated can then again degrade due to an emission of a photon of corresponding wavelength. This constant absorbing and releasing of photons and the associated energy conversion and energy distribution among the individual degrees of freedom of a molecule is subject to a statistical process, which is not discussed here in any detail.

Electromagnetic radiation in the microwave and infrared ranges in the main stimulates molecules to rotate. Electromagnetic radiation in the infrared range preferably stimulates molecules to vibrate. There are two different types of vibration: valence (stretching) vibrations and deformation vibrations. The former ensure that two atoms of a molecule vibrate along their bond axis, whilst the second type of vibration is a vibration which takes place between at least three atoms of a molecule with the bond angle changing.

The photons of the electromagnetic radiation in the UV wavelength range already possess so much energy that they are able to lift individual electrons of a molecular structure into higher molecular orbitals or even to detach the electrons from their molecular bond, i.e. to ionise the molecules. The excited electrons are, in particular, valence electrons, therefore electrons which reside in the outermost molecular orbital. The removal of core electrons requires distinctly higher photon energies, in particular in the Roentgen wavelength range. Transmission is highest in those wavelength ranges, in which there can be no excitation of the electrons from a highest occupied molecular orbital, HOMO) into a lowest occupied molecular orbital, LUMO). Since the photons cannot interact with the electrons because lifting the electrons from a HOMO into a LUMO orbital is not possible, the photons pass unhindered through the solid body, in particular the polymer, most preferably the bonding adhesive.

The molecular orbital theory therefore already gives hints as to the permitted chemical structure of a bonding adhesive according to the invention.

Radiation Source, in Particular Photon Source

According to the invention a photon source is used in particular as a radiation source.

The source therefore is predominantly, preferably exclusively, a photon source. The photon source, in particular at least predominantly, preferably completely, radiates within one or more of the following wavelength ranges:
  microwaves, 300 mm-1 mm,
  infrared, in particular
  near infrared, 0.78 µm-3.0 µm,
  mid infrared, 3.0 µm-50 µm,
  far infrared, 50 µm-1000 µm,
  visible light 380 nm-780 nm,
  UV light, in particular
  near UV light 360 nm-315 nm,
  mid UV light, 315 nm-280 nm,
  far UV light, 280 nm-200 nm,
  vacuum UV, 200 nm-100 nm
  xtreme UV light, 121 nm-10 nm
  X-ray light, 0.25 nm-0.001 nm.

The following wavelength ranges are preferred: 1000 µm to 10 nm, more preferably 780 nm to 100 nm, most preferably 370 nm to 200 nm.

It would also be possible to use a source, which can generate two different wavelength ranges. In this case all said inventive conditions apply to each individual wavelength. A combination of UV light and IR light would be particularly preferable. The IR light predominantly serves to heat the soluble layer, the UV light predominantly serves to break up covalent compounds. In such a combination the inventive bonding adhesive must comprise low absorption in both wavelength ranges.

According to the invention coherent photon sources are preferred, at least predominantly, preferably exclusively, in particular microwave sources, preferably lasers, or lasers which are configured as coherent photon sources for visible light, UV light and X-ray light.

The photon sources can be operated in continuous mode or (preferably) in pulsed mode. The pulse times are in particular less than 1 s, preferably less than 1 ms, more preferably less than 1 µs, most preferably less than 1 ns. The times between two consecutive pulses are preferably larger than 1 ms, more preferably larger than 100 ms, most preferably larger than 1 s.

The wavelength of the photon source, in particular, is chosen such that the photon stream, at least predominantly, preferably completely, can radiate through the connection layer, in particular through the bonding adhesive, without suffering any noticeable loss due of absorption.

Absorption of the photons through the connection layer is in particular less than 50%, preferably less than 25%, more preferably less than 10%, most preferably less than 1%, at the very most preferably less than 0.1%. Thus transmission of the photons through the connection layer would be, in particular more than 50%, preferably more than 75%, more preferably more than 90%, most preferably more than 99%, at the very most preferably more than 99.9%. The absorption values refer to the layer thickness which was chosen based on the material property and the demands on the product wafer.

In particular the connection layer and the photon source/the properties of the electromagnetic radiation are chosen such (in particular by choosing the material oneself) and/or adjusted such that the connection layer is not noticeably heated. In particular heating is less than 50° C., preferably less than 25° C., more preferably less than 10° C., most preferably less than 1° C., at the very most preferably less than 0.1° C. In particular heating can be substantially excluded by using photon sources with electromagnetic wavelength ranges, which do not excite neither the vibratory nor the rotational degrees of freedom of the molecules of the connection layer. In order to prevent heating, electromagnetic rays in the UV-VIS wavelength range are preferably used in combination with a connection layer which is transparent to UV-VIS.

A radiation source according to the invention, in particular an electromagnetic photon source will now be described as a preferred embodiment, which in this case is a laser. Instead of the laser the radiation sources above-mentioned may be used.

A quantitative analysis of the transparency of a solid body, in particular a polymer, preferably the connection layer according to the invention, is carried out by means of UV-VIS spectrometers. The UV-VIS spectrum is a graph which depicts the transmission of the photons of a specific wavelength as the function of the wavelength.

Carrier Substrate

As regards a preferred embodiment of the carrier substrate the most important factor is its transparency for the wavelength of the laser used (electromagnetic radiation as per the invention). According to the invention the carrier substrate is responsible for coupling the laser beam into the substrate stack (product-substrate-to-carrier-substrate bond) so that the product substrate, in particular if functional (metallic) units and/or raised structures are present, can be, at least predominantly, non-transparent to the wavelength of the laser. The carrier substrate is preferably chosen from a material, which does not weaken the intensity of the laser beam to any noticeable extent. The carrier substrate is comprised in particular predominantly, preferably completely, of one or more of the following materials:
  glass
  mineral, in particular sapphire
  semi-conductor material, in particular silicone
  polymer
  composite material According to the invention glass is the preferred material for the carrier substrate.

The thickness of the carrier substrate is in particular, chosen large enough in order to ensure that the product substrate is sufficiently stable (in particular in conjunction with the connection layer).

The thickness of the carrier substrate is in particular larger than 100 µm, preferably larger than 500 µm, more preferably larger than 1000 µm, most preferably larger than 1500 µm, at the very most preferably larger than 2000 µm.

At the same time the thickness is chosen to be as small as possible, so that the intensity of the laser beam is weakened as little as possible. The thickness of the carrier substrate is in particular less than 2000 µm preferably less than 1750 µm, still more preferably less than 1500 µm, most preferably less than 1250 µm, at the very most preferably less than 900 µm.

Connection Layer, in Particular Bonding Adhesive

The bonding adhesive is chosen from in particular one or more of the following materials:
  polymers, in particular
    Inorganic polymers, preferably
      polyphosphazenes,
      polysiloxanes, silicones,
      polysilanes,
    organic polymers, in particular
      acryl ester styrene acrylonitrile,
      acrylonitrile/methyl methacrylate,
      acrylonitrile/butadiene/acrylate,
      acrylonitrile/chlorinated, polyethylene/styrene,
      acrylonitrile-butadiene-styrene,
      acryl polymers,
      alkyd resins,
      butadiene-rubber, butyl rubber,
casein plastics, artificial horn,
cellulose acetate,
cellulose ester and derivatives,
cellulose hydrate,
cellulose nitrate,
chitin, chitosan,
chloroprene rubber,
cyclo-olefin copolymers,
standardised polyvinylchloride,
epoxy resin,
ethylene ethyl acrylate copolymer
ethylene polyvinyl acetate,
ethylene propylene copolymer,
ethylene propylene diene rubber,
ethylene vinyl acetate,
expandable polystyrene,
fluorinated rubber,
urine formaldehyde resin,
urea resins,
isoprene rubber,
lignin,
melamine formaldehyde resin,
melamine resins,
methyl acrylate/butadiene/styrene,
natural rubber,
perfluoralkoxy alkane,
phenol formaldehyde resin,
polyacetals,
polyacrylonitrile,
polyamide,
polybutylene succinate,
polybutylene terephthalate,
polycaprolactone,
polycarbonate,
polychlorotrifluoroethylene,
polyester,
polyester amide,
polyester alcohols,
polyester block amide,
polyester imide,
polyester ketone,
polyester sulfone,
polyester ethylene,
polyester terephthalate,
polyhydroxylalkanoates,
polyhydroxybutyrate,
polyimide,
polyisobutylene,
polylactide,
polymethacrylmethylimide,
polymethyl methacrylate,
polymethyl pentene,
polyoxymethylene or polyacetal,
polyphenyl ether,
polyphenyl sulphide,
polyphthalamide,
polypropylene,
polypropylene copolymers,
polypyrrol,
polystyrene,
polysulfone,
polytetrafluorethylene,
polytrimethylene terephthalate,
polyurethane,
polyvinyl acetate,
polyvinyl butyral,
polyvinyl chloride (hard PVC),
polyvinyl chloride (soft PVC),
polyvinylidene fluoride,
polyvinyl pyrrolidone,
styrene acrylonitrile copolymer,
styrene butadiene rubber,
styrene butadiene styrene,
synthetic rubber,
thermoplastic polyurethane,
unsaturated polyester,
vinyl acetate copolymers,
vinyl chloride/ethylene/methacrylate,
vinylchloride/ethylene,
vinylchloride vinylacetate copolymers,
softened polyvinyl chloride.

Above all inorganic polymers such as silicone have a comparatively high transparency for a wide wavelength range of lasers as radiation source (preferred lasers according to the invention) and are therefore, according to the invention preferably used as a bonding adhesive.

The bonding adhesive is preferably applied by means of the following process steps:

In a first process step the bonding adhesive is applied by means of a spin-coating process. In a second process step a heat treatment is carried out for removing any solvents. The temperature of the heat treatment lies in particular above 50° C.m preferably, preferably above 75° C., more preferably above 100° C., most preferably above 100° C., at the very most preferably above 150° C. Preferably the temperature of the heat treatment is below 500° C.

Soluble Layer

The soluble layer may be comprised of any random material, which at least on one side of the soluble layer, preferably the side facing the product substrate, leads to a reduction in adherence under the impact of the described electromagnetic radiation. The soluble layer according to the invention is completely sublimated, in particular under the impact from electromagnetic radiation.

With a special embodiment according to the invention the soluble layer may be configured as a laminated foil.

The soluble layer according to the invention is preferably configured or applied as a molecular layer, in particular as a mono-layer. In particular the layer thickness of the soluble layer according to the invention is less than 100 μm, preferably less than 50 μm, more preferably less than 10 μm, most preferably less than 500 nm, at the very most preferably less than 1 nm.

The physical and/or chemical properties of the soluble layer with reference to the electromagnetic radiation are chosen, in particular at least partially, preferably predominantly, more preferably completely, so as to complement the corresponding physical and/or chemical properties of the connection layer and/or the carrier substrate (in particular by means of material choice) and/or set (in particular by setting parameters such as pressure, moisture, temperature). The impacting electromagnetic radiation is, in particular at least predominantly, preferably completely, absorbed by the soluble layer according to the invention.

The absorption of the electromagnetic radiation, in particular of the photons, by the soluble layer according to the invention is in particular, greater than 50%, preferably greater than 75%, more preferably greater than 90%, most preferably greater than 99%, at the very most preferably greater than 99.9%. Transmission would therefore be less than 50%, preferably less than 25%, more preferably less than 10%, most preferably less than 1%, at the very most preferably less than 0.1%. Here too the absorption values are set in relation to the layer thickness, which was selected based on the material properties and the demands on the product wafer.

Preferably the materials of the soluble layer and the electromagnetic radiation are chosen such that due to the interaction between the electromagnetic radiation and the soluble layer, a highest possible number of rotational and/or vibratory degrees of freedom are excited and/or a highest possible number of electrons are moved from a highest occupied molecular orbital into a lowest occupied molecular orbital. Preferably the interaction takes place, in particular exclusively, in the UV-VIS spectrum. As a result there is a direct impact on the electron structure, and preferably no excitation of the rotational and/or vibratory degrees of freedom. For an excitation of the rotational and/or vibratory degrees of freedom would lead to a heating of the soluble layer according of the invention and thus to a heating of the adjacent product substrate.

The material of the soluble layer and the electromagnetic radiation are chosen in particular in such a way that the temperature increase of the soluble layer, due to the interaction with the electromagnetic radiation, is less than 50° C., preferably less than 25° C., more preferably less than 10° C., most preferably less than 1° C., at the very most preferably less than 0.1° C. Heating can be in particular substantially excluded in that photon sources with electromagnetic wavelength ranges are used, which do not excite neither the vibratory nor the rotational degrees of freedom. In order to prevent heating therefore, according to the invention use is made above all of electromagnetic rays in the UV-VIS wavelength range.

A moderate heating of the soluble layer may be desirable according to the invention, because disintegration of the soluble layer according to the invention is encouraged due to the increased thermal movement. Heating is preferably at least 0.1° C., more preferably at least 1° C., more preferably at least 5° C., more preferably at least 10° C.

The materials considered suitable as soluble layers are in particular as follows:
  polymers, in particular
    organic polymers, in particular
      acryl ester styrene acrylonitrile,
      acrylonitrile/methyl methacrylate,
      acrylonitrile/butadiene/acrylate,
      acrylonitrile/chlorinated, polyethylene/styrene,
      acrylonitrile-butadiene-styrene,
      acryl polymers,
      alkyd resins,
      butadiene-rubber,
      butyl rubber,
      casein plastics, artificial horn.
      cellulose acetate,
      cellulose ester and derivatives,
      cellulose hydrate,
      cellulose nitrate,
      chitin, chitosan,
      chloroprene rubber,
      cycloolefin copolymers,
      standardised polyvinylchloride,
      epoxy resin,
      ethylene ethyl acrylate copolymer
      ethylene polyvinyl acetate,
      ethylene propylene copolymer,
      ethylene propylene diene rubber,
      ethylene vinyl acetate,
      expandable polystyrene,
      fluorinated rubber,
      urea formaldehyde resin,
      urea resins,
      isoprene rubber,
      lignin,
      melamine formaldehyde resin,
      melamine resins,
      methyl acrylate/butadiene/styrene,
      natural rubber,
      perfluoralkoxy alkane,
      phenol formaldehyde resin,
      polyacetals,
      polyacrylonitrile,
      polyamide,
      polybutylene succinate,
      polybutylene terephthalate,
      polycaprolactone,
      polycarbonate
      polycarbonates,
      polychlorotrifluoroethylene,
      polyester,
      polyester amide,
      polyester alcohols,
      polyester block amide,
      polyester imide,
      polyester ketone,
      polyester sulfone,
      polyethylene,
      polyester terephthalate,
      polyhydroxyalkanoates,
      polyhydroxybutyrate,
      polyimide,
      polyisobutylene,
      polylactide,
      polymethacrylmethylimide,
      polymethyl methacrylate,
      polymethyl pentene,
      polyoxymethylene or polyacetal,
      polyphenyl ether,
      polyphenyl sulphide,
      polyphthalamide,
      polypropylene,
      polypropylene copolymers,
      polypyrrol,
      polystyrene,
      polysulfone,
      polytetrafluorethylene,
      polytrimethylene terephthalate,
      polyurethane,
      polyvinyl acetate,
      polyvinyl butyral,
      polyvinyl chloride (hard PVC),
      polyvinyl chloride (soft PVC),
      polyvinylidene fluoride,
      polyvinyl pyrrolidone,
      styrene acrylonitrile copolymer,
      styrene butadiene rubber,
      styrene butadiene styrene,
      synthetic rubber,
      thermoplastic polyurethane,
      unsaturated polyester,
      vinyl acetate copolymers,
      vinyl chloride/ethylene/methacrylate,
      vinylchloride/ethylene,
      vinylchloride vinylacetate copolymers,
      softened polyvinyl chloride.
  Inorganic polymers
      polyphosphazenes polysiloxanes, silicones
polysilanes
metals, in particular Cu, Ag, Au, Al, Fe, Ni, Co, Pt, W, Cr, Pb, Ti, Ta, Zn, Sn
metal alloys
non-metals
ceramics
glasses
metallic glasses
non-metallic glasses, in particular
organic no-metallic glasses
inorganic non-metallic glasses, in particular
non-oxidic glasses, in particular
halide glasses
chalcogenide glasses
oxidic glasses, in particular
phosphatic glasses
silicatic glasses, in particular
alumino-silicate glasses
lead-silicate glasses
alkali-silicate glasses, in particular
alkali and alkaline earth silicate glasses
borosilicate glasses
borate glasses, in particular alkali borate glasses According to the invention soluble layers from polymers are preferably used.

The polymers are suitable as soluble layers in particular due to their immense number of types of bond, in particular sigma bonds, Pi bonds, resonance stabilised aromatic compound bonds (benzene rings). These bonds result in quite complicated UV-VIS spectra, wherein there occur wavelength ranges, in which resonance interaction starts to happen between incident photons and the electrons.

The metals and metal alloys have absorption spectra of crystalline solid bodies. Metals and metal alloys can be heated in particular through photon excitation and these are therefore suited as soluble layers.

Ceramics and glasses comprise the least interaction effect. They are mostly amorphous or at least partly amorphous.

The soluble layer is preferably applied using the following process steps:

In a first process step the soluble layer is applied by a spin-coating process.

In a second process step heat treatment takes place in order to remove any solvents. The temperature of the heat treatment lies in particular above 50° C., preferably above 75° C., more preferably above 100° C., most preferably above 100° C., at the very most preferably above 150° C. Preferably the temperature of the heat treatment lies below 500° C.

In a third process step the second heat treatment is carried out at higher temperatures in order to harden the soluble layer. The temperature of the heat treatment lies in particular above 100° C., preferably above 150° C., more preferably above 200° C., most preferably above 250° C., at the very most preferably above 300° C. Hardening can also be carried out by means of electromagnetic radiation, in particular by UV light. Chemical hardening is also feasible, using a process gas. In particular hardening can be carried out using air humidity.

With a first embodiment according to the invention the substrate stack (product-substrate-to-carrier-substrate bond) comprises a product substrate, an inventive soluble layer applied, in particular full surface, to the product substrate, a bonding adhesive (connection layer) and a carrier substrate.

The surface of the product substrate does not have to be flat. It is feasible that there are functional units with raised structures on the topside of the product substrate, which are also coated.

According to the invention a substrate stack of this kind is manufactured in particular by one or more of the process steps described below:

In a first process step according to the invention the product substrate is coated, in particular full-surface, with the inventive soluble layer. Coating of the inventive soluble layer can be effected by spin-coating (preferred), spray-coating or by blanket coating. If the inventive soluble layer is a foil, this is preferably laminated.

In a second process step according to the invention the bonding adhesive (connection layer) is applied. The bonding adhesive can be applied either onto the inventive soluble layer, therefore onto the product substrate and/or onto the carrier substrate.

In a third process step according to the invention the two substrates are bonded to each other (brought into contact with each other, in particular under pressure). An alignment process can be carried out prior to bonding.

With a second embodiment according to the invention the substrate stack (product-substrate-to-carrier-substrate bond) comprises a product substrate, a non-stick coating applied centrally to the product substrate and a peripherally applied inventive soluble layer, a bonding adhesive (connection layer) and a carrier substrate.

According to the invention a substrate stack of this kind is manufactured in particular by one or more process steps described hereunder:

In a first process step according to the invention the product substrate is concentrically coated with a non-stick coating. The non-stick coating can be applied by way of spin-coating or spray-coating. The non-stick coating is not applied over the entire surface. In particular a peripheral ring remains uncoated, the ring width being less than 10 mm, preferably less than 5 mm, more preferably less than 3 mm, most preferably less than 2 mm, at the very most preferably less than 1 mm. In order to obtain such a centric coating with an uncoated peripheral ring, the product substrate is masked in the area of the peripheral ring.

In a second process step according to the invention the peripheral ring of the product substrate is coated with the inventive soluble layer. Coating of the inventive soluble layer can be effected by means of spin-coating, spray-coating or blanket-coating. If the inventive soluble layer is a foil, this is preferably laminated in the peripheral region. Full-surface laminating and removal of the central part of the foil is also feasible.

In a third process step according to the invention the bonding adhesive is applied. The bonding adhesive can be applied either to the inventive soluble layer, therefore to the product substrate and/or to the carrier substrate.

In a fourth process step according to the invention the two substrates are bonded together (brought into contact with each other, in particular under pressure). Prior to bonding an alignment process may be performed.

Impacting the inventive soluble layer (in particular by means of the electromagnetic radiation) is effected either by the carrier, concentrated on the periphery, or exclusively from the side. Or impacting the inventive soluble layer of the substrate stack may in particular be effected using a plant, which is mentioned in PCT/EP2015/050607.

With a third embodiment according to the invention the substrate stack comprises a product substrate, a bonding adhesive and a non-stick layer applied centrally to the carrier substrate and an inventive soluble layer applied peripherally. This embodiment is an extension of the patent specification US20090218560A1.

Debonding Operation

Prior to the debonding operation according to the invention the product substrate is preferably fixed to a film clamped to a film frame. The film frame and the film stabilize the relatively thin product substrate after removing the carrier substrate. The carrier substrate is preferably not removed until after the product substrate has been applied to the film attached to the film frame.

The debonding operation is preferably effected by a laser. The laser acts on the soluble layer and thereby reduces the adhesive strength/force between the product substrate and the connection layer according to the first two inventive embodiments/the carrier substrate and the bonding adhesive according to the third inventive embodiment. The adhesive strength/force is in particular reduced by more than 50%, preferably by more than 75%, more preferably by more than 90%.

Debonding of the substrate stack according to the inventive second and third embodiments may in particular be performed in a plant, which is described in the publication PCT/EP2015/050607.

Following the debonding operation the surface of the product substrate is preferably cleaned. A further important aspect according to the invention is that a complete removal of the soluble layer according to the first inventive embodiment leads to a product substrate with a relatively clean surface, the cleaning of which is therefore quicker and more cost-efficient.

Insofar as features relating to the method have been disclosed these are considered as disclosed also for the device and vice-versa.

Further advantages, features and details of the invention are revealed in the description hereunder of preferred exemplary embodiments and in the figures.

BRIEF DESCRIPTION OF THE DRAWINGS

FIG. 1b shows a schematic view (not true to scale) of an embodiment of an inventive method for separating the product-substrate-to-carrier-substrate bond as per FIG. 1a.

FIG. 2b shows a schematic view (not true to scale) of an embodiment of an inventive method for separating the product-substrate-to-carrier-substrate bond as per FIG. 2a.

In the Figures identical components or functionally identical components have been marked with the same reference symbols.

DETAILED DESCRIPTION OF THE INVENTION

Figure 1A:
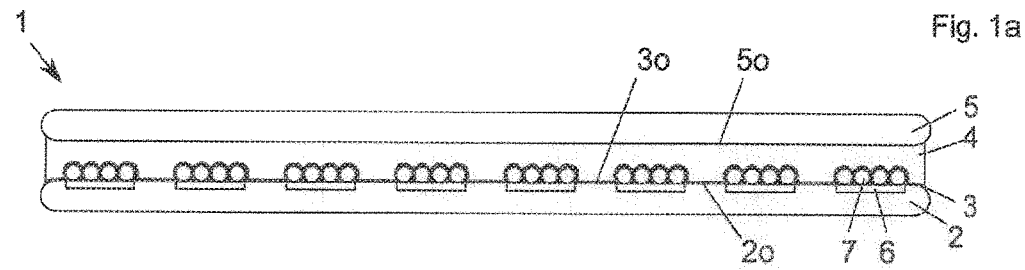
FIG. 1a shows a schematic view (not true to scale) of a first embodiment of an inventive product-substrate-to-carrier-substrate bond.

All product substrates 2 shown can comprise functional units 6. Also feasible, however, are product substrates which in particular do not comprise any corresponding functional units 6. The functional units 6 may for example be microchips, storage modules, MEMs components etc. It is also feasible that the functional units 6 comprise raised structures 7 such as solder balls. These raised structures 7 may have different shapes, and coating them with the soluble layer 3 is therefore difficult and/or incomplete. When speaking of coating the product substrate 2, this includes the coating of functional units 6 and/or of raised structures 7.

FIG. 1a shows a schematic first inventive embodiment (not true to scale) of an inventive substrate stack 1 comprising at least one product substrate 2, a soluble layer 3, a bonding adhesive as connection layer 4 and a carrier substrate 5. An inventive soluble layer 3 is applied, in particular full-surface, on top of the topography of the provided product substrate 2 with its (potential) functional units 6 and raised structures 7. The soluble layer surface 3o adjoins the bonding adhesive which in turn is connected to the carrier substrate 5.

Figure 1B:
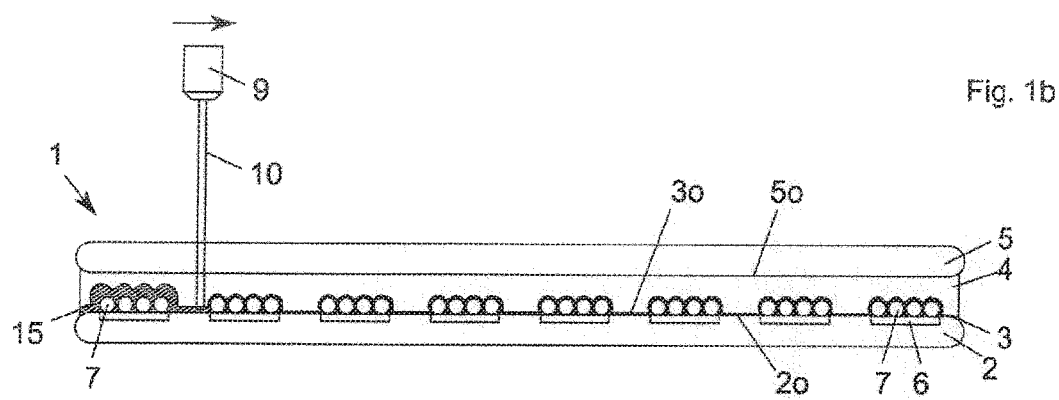

FIG. 1b shows a schematic view (not true to scale) of a debonding operation according to the invention. A laser 9 generates a laser beam 10, which penetrates via the carrier substrate 5 into the bonding adhesive. According to the invention absorption of the bonding adhesive is minimal due to the inventive synchronisation of the wavelength of the laser beam 10. The laser beam 10 therefore advances, in particular at a minimal, more preferably at a negligibly low, loss of energy, through to the soluble layer 3.

According to the invention interaction between the photons of the laser beam 10 and the soluble layer 3 is much higher than with the bonding adhesive, preferably maximal. The soluble layer 3 is, at least partially, preferably predominantly, more preferably completely, dissolved or destroyed. At the very least the adhesive strength between product substrate 2 and bonding adhesive is diminished.

The laser 9 scans in particular the entire surface 3o of the soluble layer, in particular by a movement in x-direction and/or y-direction. It is also feasible to move the laser beam 10 in z-direction in order to ensure better focusing, insofar as the laser beam 10 could not be optimally parallelised.

Figure 2A:
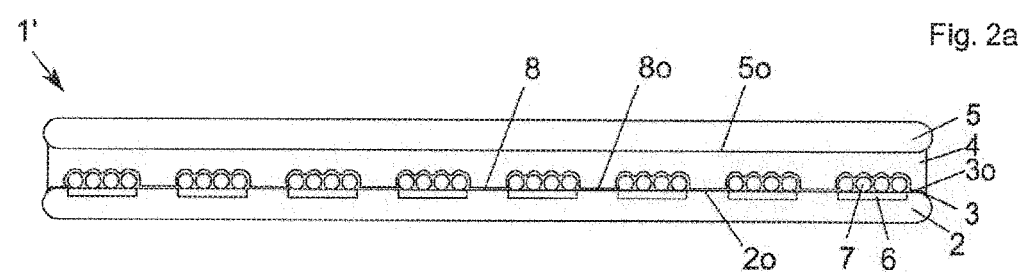
FIG. 2a shows a schematic view (not true to scale) of a second embodiment of an inventive product-substrate-to-carrier-substrate bond.

FIG. 2a shows a second schematic inventive embodiment (not true to scale) of a substrate stack 1' comprising at least one product substrate 2, a soluble layer 3 applied exclusively to the periphery of the product substrate 2, a non-stick layer 8 applied centrically to the product substrate 2, a connection layer 4 configured as a bonding adhesive and a carrier substrate 5. The adhesive effect between the non-stick layer 8 and the bonding adhesive is minimal according to the invention, whilst the adhesive strength existing between the inventive soluble layer 3 and the bonding adhesive is comparatively high (at least twice as high).

Figure 2B:
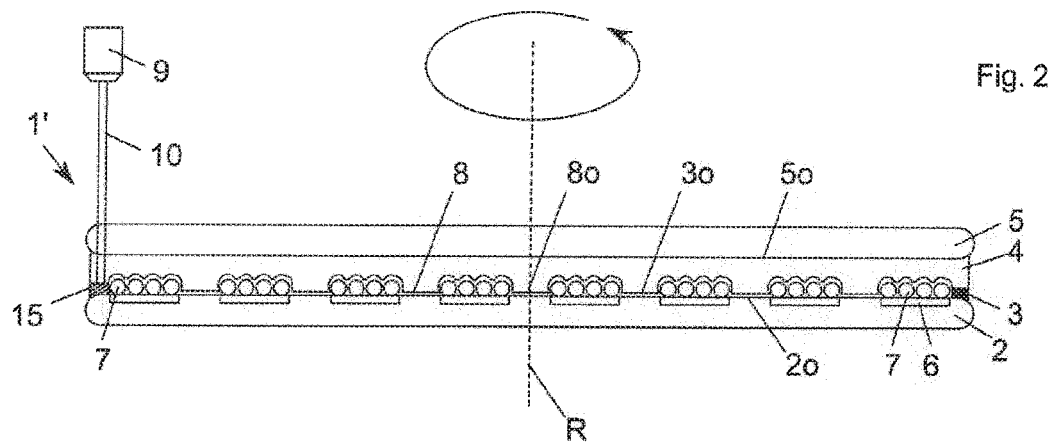

FIG. 2b shows the disintegration of the soluble layer 3 of the second inventive embodiment shown in FIG. 2a. The laser beam 10 is preferably concentrated onto the periphery of the substrate stack 1'. Preferably the plant is designed such that the laser 9 is stationary, whilst the substrate stack 1' rotates about a rotary axis R.

Figure 3:
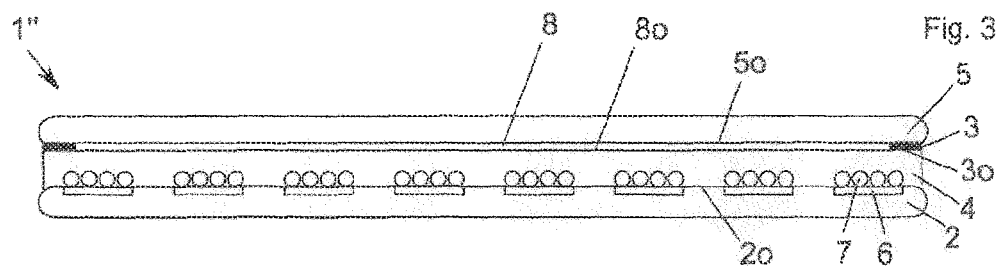
FIG. 3 shows a schematic view (not true to scale) of a third embodiment of an inventive product-substrate-to-carrier-substrate bond.

FIG. 3 shows a schematic third inventive embodiment (not true to scale) of a substrate stack 1" according to the invention, comprising at least one product substrate 2, a connection layer 4 configured as a bonding adhesive, a soluble layer 3 applied exclusively to the periphery of the carrier substrate 5, a non-stick layer 8 applied centrically to the carrier substrate 5 and a carrier substrate 5.

The soluble layer 3 is applied to the periphery of the carrier substrate 5, wherein the soluble layer 3 is sensitive to the wavelength of the laser beam 10 used. The debonding operation is effected either due to the construction of the inventive embodiment shown in FIG. 2b or by the plant revealed in the publication PCT/EP2015/050607.

Figure 4:
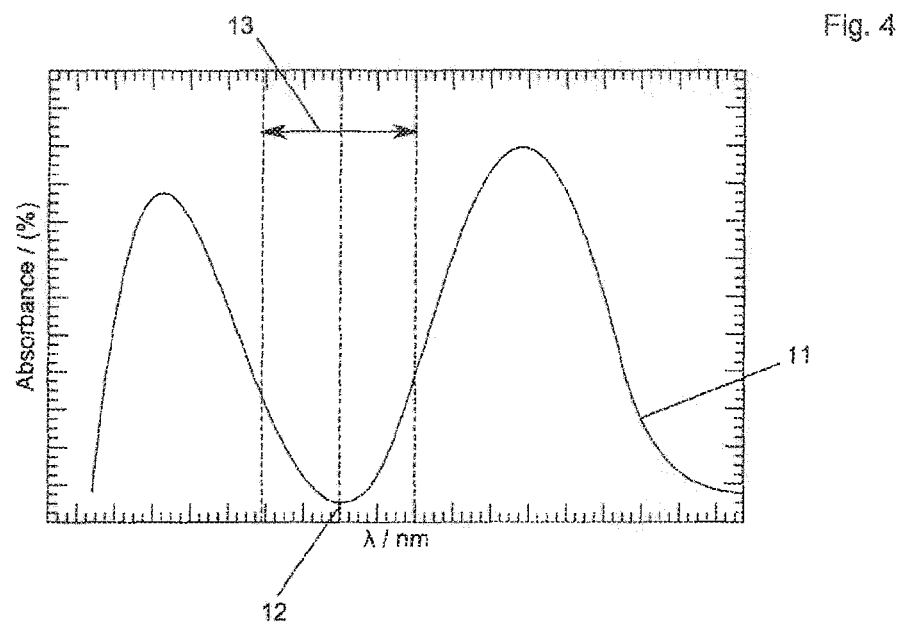
FIG. 4 shows a schematic view (not true to scale) of a first absorption diagram (absorbance=absorption).

FIG. 4 shows an absorption graph 11 in a cut-out of an absorption spectrum of the bonding adhesive. The absorption spectrum is, in particular, a UV-VIS absorption spectrum. The absorption graph 11 has preferably at least one, in particular more than two, more preferably more than three, most preferably more than four, at the very most preferably more than five local absorption minima 12.

For clarity's sake only one local absorption minimum 12 is centrically shown in the absorption graph 11. The local absorption minimum 12 is part of an optimal absorption area 13, wherein the wavelength of the laser beam 10 of laser 9 to be used according to the invention is adjusted to match the wavelength range thereof.

According to the invention the bonding adhesive used is chosen such that the wavelength of the used laser beam 10 lies within the optimal absorption area 13, preferably exactly matches the absorption minimum 12. In this way it is ensured that the bonding adhesive for the laser beam 10 has a maximum transparency according to the invention.

Figure 5:
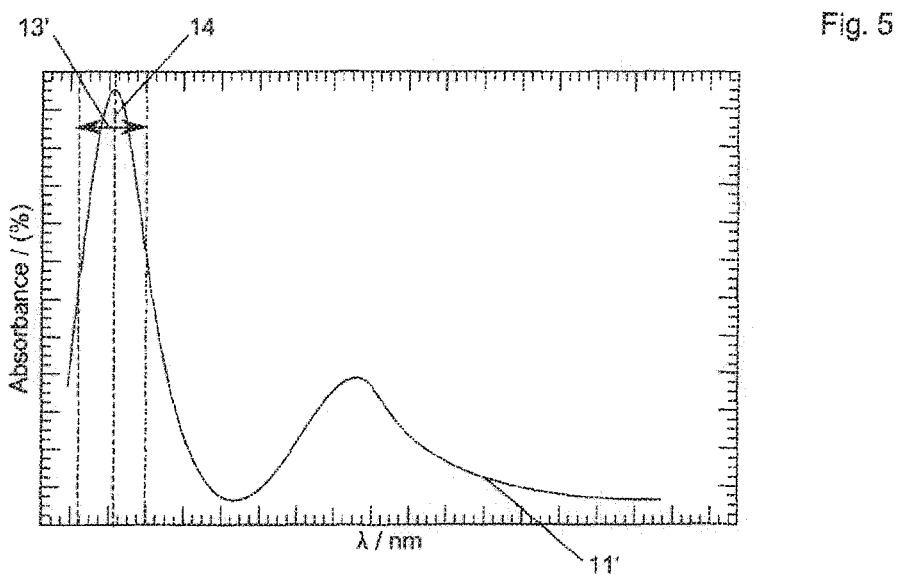
FIG. 5 shows a schematic view (not true to scale) of a second absorption diagram (absorbance=absorption).

FIG. 5 shows an absorption graph 11' in a cut-out of an absorption spectrum of the soluble layer 3. The absorption spectrum is, in particular, a UV-VIS absorption spectrum. The absorption graph 11' preferably comprises at least one, in particular more than two, more preferably more than three, most preferably more than four, at the very most preferably more than five absorption maxima 14. For clarity's sake only two local absorption maxima 14 are shown in the absorption graph 11'.

The local absorption maximum 14 is part of an optimal absorption area 13', wherein the wavelength of the laser beam 10 of laser 9 to be used should be adjusted to match the wavelength range thereof. According to the invention the soluble layer 3 is chosen such that the wavelength of the used laser beam 10 lies within the optimal absorption area 13', preferably exactly matches the absorption maximum 14. In this way it is ensured that the absorption of the soluble layer for the laser beam 10 is at its maximum according to the invention.

According to the invention it is above all of crucial importance that the soluble layer 3 is at all reached by the laser beam 10 to any noticeable extent. Insofar as the wavelength of the laser beam 10, of the bonding adhesive 4 and of the soluble layer 3 cannot be optimally adjusted relative to each other, one should preferably proceed in such a way that at least the wavelength of the laser beam 10 is tuned to match at least one or more absorption minima of the bonding adhesive, in order to allow the photons of the laser beam 10 to gain the most unhindered access possible to the soluble layer 3.

LIST OF REFERENCE SYMBOLS 1, 1', 1" substrate stack (product-substrate-to-carrier-substrate bond)
2 product substrate
3 soluble layer
3o surface of soluble layer
4 connection layer
5 carrier substrate
5o surface of carrier substrate
6 functional unit
7 raised structures
8 non-stick layer
8o surface of non-stick layer
9 laser
10 laser beam
11 absorption graph
12 absorption minimum
13 optimal absorption area
14 absorption maximum
15 dissolved soluble layer
R rotary axis Having described the invention, the following is claimed:

1. A product-substrate-to-carrier-substrate bond with a product substrate, which is bonded to a carrier substrate via a connection layer, wherein a soluble layer is arranged between the connection layer and the product substrate, and wherein
   a) the soluble layer is soluble due to an interaction with an electromagnetic radiation of a radiation source, and
   b) the connection layer and the carrier substrate are both at least predominantly transparent to electromagnetic radiation transmitted through the connection layer,
      wherein a material of the soluble layer and the electromagnetic radiation are chosen such that an increase of temperature of the soluble layer caused by the interaction with the electromagnetic radiation is less than 50° C.

2. The product-substrate-to-carrier-substrate bond with a product substrate according to claim 1, wherein physical and/or chemical properties of the soluble layer, with respect to the electromagnetic radiation, are complement corresponding physical and/or chemical properties of the connection layer and/or the carrier substrate.

3. The product-substrate-to-carrier-substrate bond with a product substrate according to claim 1, wherein an absorption of photons of the electromagnetic radiation in the connection layer is less than 50%.

4. The product-substrate-to-carrier-substrate bond with a product substrate according to claim 1, wherein an absorption of photons of the electromagnetic radiation in the soluble layer is more than 50%.

5. The product-substrate-to-carrier-substrate bond with a product substrate according to claim 1, wherein a temperature of the connection layer increases by less than 50° C. during debonding.

6. The product-substrate-to-carrier-substrate bond with a product substrate according to claim 1, wherein the soluble layer is sublimated by the electromagnetic radiation.

7. The product-substrate-to-carrier-substrate bond with a product substrate according to claim 1, wherein the soluble layer is applied between the connection layer and the product substrate with a layer thickness less than 10 μm.

* * * * *